United States Patent
Chang et al.

(10) Patent No.: US 10,537,939 B2
(45) Date of Patent: Jan. 21, 2020

(54) METHOD OF MANUFACTURING A HONEYCOMB STRUCTURE FOR AN ELECTRONIC DEVICE

(71) Applicant: HEWLETT-PACKARD DEVELOPMENT COMPANY, L.P., Houston, TX (US)

(72) Inventors: Chi Hao Chang, Taipei (TW); Chien-Ting Lin, Taipei (TW); Kuan-Ting Wu, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 9 days.

(21) Appl. No.: 15/519,693

(22) PCT Filed: Jan. 21, 2015

(86) PCT No.: PCT/US2015/012163
§ 371 (c)(1),
(2) Date: Apr. 17, 2017

(87) PCT Pub. No.: WO2016/118124
PCT Pub. Date: Jul. 28, 2016

(65) Prior Publication Data
US 2017/0312823 A1    Nov. 2, 2017

(51) Int. Cl.
*H05K 3/36* (2006.01)
*B22F 3/11* (2006.01)
(Continued)

(52) U.S. Cl.
CPC .......... *B22F 3/1115* (2013.01); *B22F 3/1055* (2013.01); *B33Y 10/00* (2014.12);
(Continued)

(58) Field of Classification Search
CPC ...... B22F 3/1115; B22F 3/1055; B33Y 80/00; B33Y 10/00; H05K 5/03; H05K 5/04; G06F 1/00; Y10T 29/49126; Y10T 29/49128
(Continued)

(56) References Cited

U.S. PATENT DOCUMENTS 5,618,633 A * 4/1997 Swanson .................. B22C 9/04
428/593
5,637,175 A * 6/1997 Feygin .................. B33Y 30/00
156/256
(Continued)

FOREIGN PATENT DOCUMENTS

CN    103722171    4/2014
CN    103978690    8/2014
(Continued)

OTHER PUBLICATIONS

Dorrier, J.; "Intricate 3D Printed Materials Lighter Than Water and as Strong as Steel"; Feb. 11, 2014; 4 pages.

*Primary Examiner* — Donghai D Nguyen
(74) *Attorney, Agent, or Firm* — HPI Patent Department

(57) ABSTRACT

One example provides a method of manufacturing. The method comprises printing multiple layers comprising a metal material by an additive manufacturing technique, wherein each of the multiple layers comprises an array of cavities each having a cross-section of a polygon; and assembling at least two of the multiple layers to form an article having an array of three-dimensional hollow cells collectively having a honeycomb structure.

7 Claims, 3 Drawing Sheets

(51) Int. Cl.
*B22F 3/105* (2006.01)
*B33Y 10/00* (2015.01)
*B33Y 80/00* (2015.01)
*H05K 5/03* (2006.01)
*H05K 5/04* (2006.01)

(52) U.S. Cl.
CPC ............... *B33Y 80/00* (2014.12); *H05K 5/03* (2013.01); *H05K 5/04* (2013.01); *B22F 2003/1058* (2013.01)

(58) Field of Classification Search
USPC .................................................. 29/830–832
See application file for complete search history.

(56) References Cited

U.S. PATENT DOCUMENTS

| | | | |
|---|---|---|---|
| 5,666,261 A | 9/1997 | Aguilera | |
| 5,849,122 A | 12/1998 | Kenmochi et al. | |
| 9,429,023 B2 * | 8/2016 | Godfrey | F01D 5/14 |
| 9,451,714 B2 * | 9/2016 | Jolliffe | H05K 5/0086 |
| 2004/0048027 A1 | 3/2004 | Hayes et al. | |
| 2005/0138885 A1 | 6/2005 | Rotherroe | |
| 2009/0034223 A1 | 2/2009 | Doczy et al. | |
| 2010/0321870 A1 | 12/2010 | Hirai et al. | |
| 2013/0000247 A1 | 1/2013 | Sypeck | |
| 2013/0309121 A1 | 11/2013 | Prest et al. | |
| 2014/0177138 A1 | 6/2014 | Jolliffe et al. | |
| 2014/0199175 A1 | 7/2014 | Godfrey et al. | |
| 2014/0255647 A1 | 9/2014 | Johnson et al. | |
| 2014/0361934 A1 | 12/2014 | Ely et al. | |

FOREIGN PATENT DOCUMENTS

| | | |
|---|---|---|
| CN | 104226988 | 12/2014 |
| JP | 2011008356 A | 1/2011 |
| WO | WO-2012072684 | 6/2012 |
| WO | WO-2014121060 A1 | 8/2014 |

* cited by examiner

| Making a portion of a housing of an electronic device having an electrical circuit, wherein the making comprising: printing multiple layers comprising a metal material by an additive manufacturing technique, wherein each of the multiple layers comprises an array of cavities each having a cross-section of a polygon; and assembling at least two of the multiple layers to form the portion having an array of three-dimensional hollow cells collectively having a honeycomb structure | S201 |
|---|---|
| Assembling the electrical circuit with the housing, the housing external to the electrical circuit | S202 |

Fig. 2

METHOD OF MANUFACTURING A HONEYCOMB STRUCTURE FOR AN ELECTRONIC DEVICE

BACKGROUND

The housing/casing of an electronic device may comprise multiple components. The components may include covers. In the case of a portable electronic device having a display, these covers may include a top cover ("A cover"), the display itself ("B cove"), the keyboard cover ("C cover"), and the bottom cover ("D cover"). Depending on the application, the cover may comprise a variety of suitable materials.

BRIEF DESCRIPTION OF THE DRAWINGS

The drawings are provided to illustrate various examples of the subject matter described herein related to a honeycomb structure and are not intended to limit the scope of the subject matter. The drawings are not necessarily to scale.

FIG. 2 provides a flowchart showing the processes involved in another example of a method of manufacturing.

DETAILED DESCRIPTION

Figure 1:
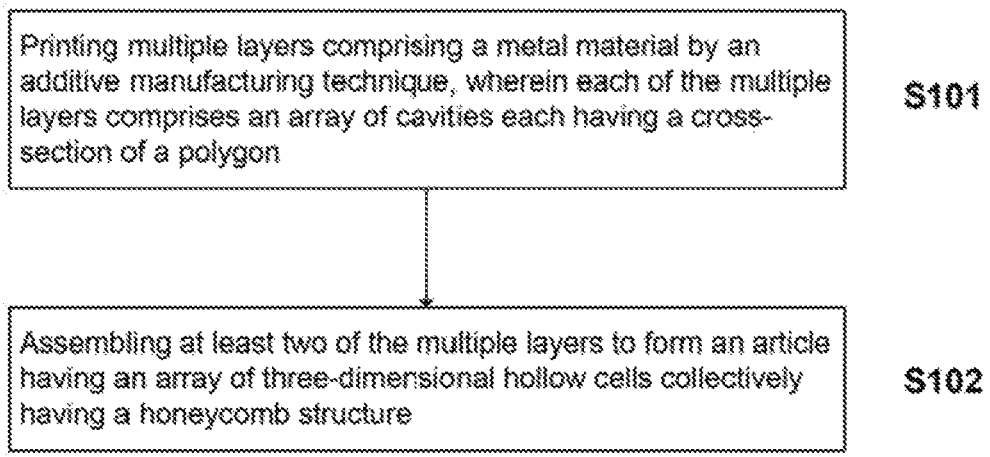
FIG. 1 provides a flowchart showing the processes involved in one example of a method of manufacturing.

The housing of electronic devices, particularly those of portable electronic devices, is frequently subject to mechanical deformation due at least in part to its frequent contact with other objects (e.g., table, hand, ground, etc.). These devices, particularly the housing thereof, often need to have materials having high mechanical strength and at the same time being light weighed so as to be portable.

In view of the foregoing, the Inventors have recognized and appreciated the advantages of a honeycomb structure, particularly one employed in the housing of an electronic device. Following below are more detailed descriptions of various examples related to a honeycomb structure, particularly methods of making same. The various examples described herein may be implemented in any of numerous ways.

Provided in one aspect of the examples is a method of manufacturing, comprising: printing multiple layers comprising a metal material by an additive manufacturing technique, wherein each of the multiple layers comprises an array of cavities each having a cross-section of a polygon; and assembling at least two of the multiple layers to form an article having an array of three-dimensional hollow cells collectively having a honeycomb structure.

Provided in another aspect of the examples is a method of manufacturing, comprising: making a portion of a housing of an electronic device having an electrical circuit, wherein the making comprising: printing multiple layers comprising a metal material by an additive manufacturing technique, wherein each of the multiple layers comprises an array of cavities each having a cross-section of a polygon; and assembling at least two of the multiple layers to form the portion having an array of three-dimensional hollow cells collectively having a honeycomb structure; and assembling the electrical circuit with the housing, the housing external to the electrical circuit.

Provided in another aspect of the examples is an electronic device, comprising: an electrical circuit and a housing external to the electrical circuit, a portion of the housing comprising a metal material and an array of three-dimensional hollow cells collectively having a honeycomb structure; wherein the honeycomb structure is an in-situ honeycomb structure of an additive manufacturing technique.

Additive Manufacturing

Methods of fabricating three-dimensional ("3-D") parts may include an additive manufacturing technique. In some instances, an additive manufacturing is known as 3-D printing. One example of an additive manufacturing is rapid prototyping. The rapid prototyping technique may be a layer-based building technique. In general, a rapid prototyping technique may be employed to build 3-D objects, layer-by-layer, from a building medium (or "build material") using data representing successive cross-sections of the object to be formed. Computer Aided Design ("CAD") and Computer Aided Manufacturing ("CAM") systems, often referred to as CAD/CAM systems, which provide the object representation to a rapid prototyping system. CAD and CAM systems may be used alone or in combination. In one example, rapid prototyping involves fabrication of a scale model of a physical part or assembly using throe-dimensional CAD data. Some examples of rapid prototyping include stereolithography, selective laser sintering, laminated object manufacturing, fused deposition modeling, solid ground curing, and inkjet printing.

Laser sintering may be employed to build solid image objects from thin layers of heat-fusible powders, including ceramics, polymers, and polymer-coated metals to which sufficient energy is imparted to solidify the layers. In some instances, metals may be directly used to be melted and sintered. Inkjet printing may be employed to build solid images from powders that are solidified when combined with a binder. Stereolithography may be employed to build solid images from thin layers of build material, such as a polymerizable liquid (e.g., resin).

Sterolithography and laser sintering systems may supply the energy for creating and building up the thin cross-sections (layers) of 3-D objects through modulation and precise directional control of lasers. In one example, the laser applies energy to a targeted area of the layer of powder or liquid building medium. The thin targeted layer is called the working surface of the building medium. In one example, rapid prototyping laser systems position the laser beam using a scanning system having galvanometer-driven mirrors that are directed by a control computer. In one example, the mirrors deflect a laser beam in response to a CAD/CAM program that has been tessellated into the STL format and sliced into cross-sectional data files that are merged into a build file.

In one example of stereolithography, 3-D objects result from successive solidification of a plurality of thin layers of a polymerizable liquid, one on top of another, until all of the thin layers join assemble together to form the resultant three-dimensional object. Each layer represents a thin cross-section of the desired three-dimensional object Polymerizable liquids may be referred to as "resins." and solidified layers of resin are said to be cured. Some examples of building media may include resins that cure sufficiently fast, usually with ultraviolet light. An ultraviolet laser may generate a small and intense spot of light that is moved across the liquid surface with a galvanometer mirror in an x-y scanner in a predetermined pattern. The scanner is driven by computer generated vectors or the like. This technique rapidly produces precise complex patterns.

During additive manufacturing, a suitable system may be employed to print, or "build," 3-D parts from digital representations of the 3-D parts (e.g., AMF and STL format files) using one or more additive manufacturing techniques. Examples of commercially available additive manufacturing techniques include extrusion-based techniques, jetting, selective laser sintering, powder/binder jetting, electron-beam melting, and stereolithographic processes. One example of such a system is a laser-based rapid prototyping equipment AM250 available from Renishaw Inc., USA. In one example, for each of these techniques the digital representation of the 3-D part (e.g., as created by CAD) may be initially sliced into multiple layers. For each sliced layer, a tool path may then be generated, which provides instructions for the particular additive manufacturing system to print the given layer.

For example, in an extrusion-based additive manufacturing system, a 3-D part may be printed from a digital representation of the 3-D part (e.g., as created by CAD) in a layer-by-layer process by extruding a flowable build (or "part") material. The part material is extruded through an extrusion tip carried by a printhead of the system and is deposited as a sequence of roads on a substrate in an x-y plane. The extruded part material fuses to previously deposited part material and solidifies upon a drop in temperature. The position of the printhead relative to the substrate may then be incremented along the z-axis (perpendicular to the x-y plane), and the process is then repeated to form a 3-D part resembling the digital representation.

In fabricating 3-D parts by depositing layers of a part material, supporting layers or structures may be built underneath overhanging portions or in cavities of 3-D parts under construction, which are not supported by the part material itself. A support structure may be built utilizing the same deposition techniques by which the part material is deposited. The host computer may generate additional geometry acting as a support structure for the overhanging or free-space segments of the 3-D part being formed. The Support material may then be deposited from a second nozzle according to the generated geometry during the printing process. The support material may adhere to the part material during fabrication, and may be removable from the completed 3-D part when the printing process is complete.

Method of Manufacturing

The honeycomb structure described herein may be manufactured by a method involving any suitable number of processes. FIG. 1 shows the processes involved in one example of such a method. The manufacturing method as shown in FIG. 1 may comprise printing multiple layers comprising a metal material by an additive manufacturing technique, wherein each of the multiple layers comprises an array of cavities each having a cross-section of a polygon (S101). The additive manufacturing technique may refer to any of those described herein. The array may be a one-dimensional or two-dimensional array. In one example, the array is a two-dimensional array.

The method may further comprise assembling at least two of the multiple layers to form an article having an array of three-dimensional hollow calls collectively having a honeycomb structure (S102). The number of layers need not be of any particular value. Depending on the application and the desired geometry, any number of layers may be used. The layers may also have any geometry in a planar view. For example, each layer may be a plate of a square, a rectangular, a polygon, or an irregular shape.

The honeycomb structure described herein, such as that manufactured by the method as shown in FIG. 1 may be employed in various applications, as described further below. Depending on the application, the method of manufacturing as described in FIG. 1 may be modified. FIG. 2 shows the processes involved in another example of a method of manufacturing an electronic device. As shown in FIG. 2, this method may comprise making a portion of a housing of an electronic device having an electrical circuit (S201). More than one electrical circuit is possible. An "electronic device" is described further below. This process of making the portion of the housing may comprise printing multiple layers comprising a metal material by an additive manufacturing technique. Each of the multiple layers may comprise an array of cavities each having a cross-section of a polygon. The process of making may further comprise assembling at least two of the multiple layers to form the portion having an array of three-dimensional hollow cells collectively having a honeycomb structure. The additive manufacturing technique may refer to any of those described herein. The array may be a one-dimensional or two-dimensional array. In one example, the array is a two-dimensional array.

Subsequently, the method of fabrication may further comprise assembling the electrical circuit with the housing, the housing external to the electrical circuit (S202). As described above, the number of layers need not be of any particular value. Depending on the application and the desired geometry, any number of layers may be used. The layers may also have any geometry in a planar view. For example, each layer may be a plate of a square, a rectangular, a polygon, or an irregular shape.

Depending on the application, any suitable material may be employed in the method of manufacturing described herein. The metal material (of the layers) may comprise a pure metal, a metal alloy, a metallic compound, or a metal-containing composite. The metal material may comprise at least one of aluminium, magnesium, lithium, zinc, titanium, niobium, iron, and copper. In one example, an iron-containing metal material is steel, such as stainless steel. The metal material may comprise an alloy of any of the aforementioned metal elements or a combination of any of the aforementioned metal elements.

The equipment that may be employed for the manufacturing method described herein is not limited. As long as the equipment may perform the processes as described herein, the equipment may be used. For example, the equipment may be commercially available from Hewlett-Packard Company, USA, Reinshaw Inc., USA, etc.

Depending on the application, the method of manufacturing described herein may involve various processes as a part of, or other than, those described above. For example, the assembling process may comprise any suitable joining process to join multiple parts. The joining process may involve physical bonding, chemical bonding, or both. An example of physical bonding may be mechanical interlocking. For example, the multiple layers described herein may be assembled by 45 degree assembling—it is noted that the degree need not be 46°, and any suitable degree may be employed. The joining process may involve welding. Any suitable welding process may be employed. For example, the assembling process may comprise at least one of laser welding and stud welding.

Additionally, in order to ensure that the final resultant hollow cells of the honeycomb structure have the desired geometry, the method of manufacturing in one example described herein further comprises aligning at least some of the cavities between the at least two of the multiple layers before the assembling process. In one example, all of the cavities in the array between the multiple layers (some or all) are aligned before the assembling process takes place. As a result, in one example, the honeycomb structure comprises a plurality of trough-thickness (of the final assembly) hollow cells and the layers are assembled, or stacked, to form a 3-D part.

Prior to the printing and assembling processes, the method of manufacturing described herein may further comprise determining the optimal parameters for the printing and/or assembling processes. For example, the determination may involve determining an optimized geometry for the cavities and/or the hollow cells, such that the optimized geometry may be used for the subsequent printing and/or assembling processes. The determination may involve using mathematical relations, such as equations, to determine the geometry that will provide the desired material mechanical properties—e.g., bending strength, tensile strength, etc. The determination may involve computer simulation to determine the optimized parameters. The computer simulation may be performed by machine-readable instructions, such as an algorithm, such as a suitable commercially available software. The determination may also involve designing by using software, such as 3-D CAD software. The process involving designing, such as that using 3-O CAD software, may involve generating the appropriate 3-D representation of a component or the whole of the final assembled structure.

Any machine-readable or machine-executable instruction, including software, described herein may be implemented by a processor. The machine-readable instruction may be implemented at least in part as a non-transitory machine-readable storage medium (or multiple machine-readable storage media)—e.g., a computer memory, a floppy disc, compact disc, optical disc, magnetic tape, flash memory, circuit configuration in Field Programmable Gate Arrays or another semiconductor device, or another tangible computer storage medium or non-transitory medium) encoded with at least one machine-readable instructions that, when executed on at least one machine (e.g., a computer or another type of processor), cause at least one machine to perform methods that implement the various examples of the technology discussed herein. The computer readable medium or media can be transportable, such that the program or programs stored thereon can be loaded onto at least one computer or other processor to implement the various examples described herein.

The term "machine-readable instruction" is employed herein in a generic sense to refer to any type of machine code or set of machine-executable instructions that may be employed to cause a machine (e.g., a computer or another type of processor) to implement the various examples described herein. The machine-readable instructions may include, but not limited to, a software or a program. The machine may refer to a computer or another type of processor. Additionally, when executed to perform the methods described herein, the machine-readable instructions need not reside on a single machine, but may be distributed in a modular fashion amongst a number of different machines to implement the various examples described herein.

Machine-executable instructions may be in many forms, such as program modules, executed by at least one machine (e.g., a computer or another type of processor). Generally, program modules include routines, programs, objects, components, data structures, etc. that perform particular tasks or implement particular abstract data types. Typically, the functionality of the program modules may be combined or distributed as desired in various examples.

Honeycomb Structure

The honeycomb structure described herein may have any configuration. The three-dimensional hollow cells may have any suitable geometry. The term "geometry" herein may encompass size and shape. Some of hollow cells may have the same geometries. In one example, all of the hollow cells have the same geometries. For example, the hollow cells may each be a tubular structure of any suitable cross-section (as reflected by that of the cavities in the layer being assembled to form the honeycomb structure). The cross-section may have any suitable and desirable geometry. For example, the cross-section may be a circle or a polygon. The tubular structure may be through-thickness of each layer to be assembled. As one example, multiple layers having a plurality of hexagon cavities stacked together may form a 3-D part having a plurality of (e.g., through-thickness) hollow tubular cells having hexagonal cross-section. The polygon may be a triangle, square, heptagon, hexagon, octagon, etc. The cross-section may also be an irregular shape. In one example, array of cavities having hexagon as cross-section on a surface may resemble that of a graphene—a planar array of hexagons.

The honeycomb structure accordingly may have any suitable geometry. For example, the honeycomb structure may be one of uniform honeycombs, space-filling polyhedra, and non-convex honeycombs. A space-filling polyhedron structure may be one of cubes, hexagonal prisms, triangular prisms, gyrated triangular prisms, truncated octahedra, rhombic dodecahedra, triakis truncated tetrahedra, trapezo-rhombic dodecahedra, elongated dodecahedra, cuboids, rhombic hexahedra, parallelepipeds, and isahedral simple fillings. In one example, the hollow cells have the geometry of an octahedron or a truncated octahedron. Other types of polyhedral are possible. Also, other types of geometries are possible.

The size of each of the hollow cells in the honeycomb structure is not limited and may vary depending on the application. The term "size" herein may refer to diameter, length, width, height, each of the edge of a polygon, etc., depending on the context. For example, the average size of the hollow cells may be less than or equal to 1 mm—e.g., less than or equal to about 500 µm, about 300 µm, about 200 µm, about 100 µm, about 50 µm, or smaller. Other values are also possible.

The final assembled layers of the honeycomb structure may have any suitable geometry. For example, the assembly may be a plate. The plate may have any suitable thickness. For example, the assembled layers may have a thickness that is less than or equal to about 2 mm—e.g., less than or equal to about 1.5 mm, about 1.0 mm, about 0.8 mm, about 0.6 mm, or smaller. Other values are also possible. Additionally, the edge shared by a adjacent two hollow cells may be relatively thin. In comparison to the thickness of the honeycomb structure. The thickness may be less than or equal to about 100 µm-less than or equal to about 50 µm, about 30 µm, about 20 µm, about 10 µm, or smaller. Other values are also possible.

Because the honeycomb structure described herein comprises 3-D hollow cells, the honeycomb structure may be lighter than a solid counterpart structure of the same dimensions and same material. For example, the honeycomb structure described herein may achieve a weight reduction (relative to a solid counterpart) of at least about 5% by weight—e.g., at least about 10%, about 15%, about 20%, about 25%, about 30%, or higher. Other reduction values are also possible.

In one example, the honeycomb structure has the aforementioned weight, in comparison to a solid counterpart, but has the same mechanical properties, including at least one of bending strength, compressive strength, tensile strength, etc., as the solid counterpart. In one example, the honeycomb structure has a Young's modulus of greater than or equal to about 40 GPa—e.g., greater than or equal to about 50 GPa, about 60 GPa, about 70 GPa, or higher. Other values are also possible. In one example, the honeycomb structure has a tensile strength of greater than or equal to about 400 MPa—e.g., greater then or equal to about 500 MPa, about 600 MPa, about 700 MPa, about 800 MPa, about 900 MPa, about 1 GPa, about 2 GPa, about 5 GPa, about 8 GPa, or higher. Other values are also possible.

Applications

Due at least in part to the numerous aforedescribed desirable properties, the honeycomb structure described herein may be employed in various applications. The honeycomb structure may be an in-situ honeycomb structure as a result of the additive manufacturing technique. For example, the honeycomb structure may be an integral part of a structural component. The component may be a part of the housing of an electronic device. A housing of a device may refer to any structural component that encloses the interior of the device. In one example, the honeycomb structure described herein is a part of the housing of an electronic device. For example, the honeycomb structure may be any part of the housing, including back cover, front cover, side cover, and the like, of the device.

Figure 3:
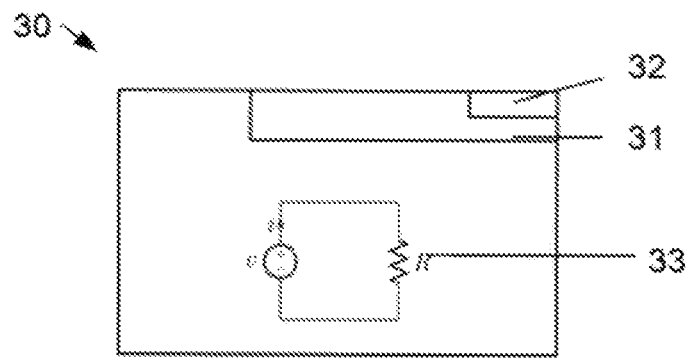
FIG. 3 shows, in one example, a schematic of an electronic device comprising a housing comprising a honeycomb structure described herein.

FIG. 3 shows, in one example, a schematic of an electronic device 30 comprising a housing 31 (only a portion is shown in the figure). The housing may comprise a portion 32 that has the honeycomb structure, such as any of those described herein. The housing (or a part thereof) 31 is external to the electrical circuit 33 in the interior of the device 30. The electrical circuit 33 may be any type of electrical circuit having any suitable configuration and component. It is noted that while FIG. 3 shows that the honeycomb structure is in a portion of the top cover, the honeycomb structure may constitute the entire cover on one side, or multiple sides, as a part of the housing of the device.

An electronic device herein may refer to any device comprising at least one electrical circuit Thus, in one example, the housing that comprises the honeycomb structure described herein may be external to the electrical circuit. The electronic device may be a consumer electronic device. An electronic device may refer to portable/mobile electronic device. An electronic device herein may refer to a computer, a memory storage, a display, a signal transmitting device, and the like. A computer may refer to a desktop, a laptop, a tablet, a phablet, a tablone, and the like. A storage unit may refer to the hardware of a hard drive, a server, a processor, and the like. A display may refer to a monitor, a liquid crystal display ("LCD"), a television, and the like. A signal transmitting device may refer to a device transmitting any type of signal, including light, sound, heat, and the like. In one example, the electronic device is a mobile phone.

Additional Notes

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

The indefinite articles "a" and "an," as used herein in this disclosure, including the claims, unless clearly indicated to the contrary, should be understood to mean "at least one," Any ranges cited herein are inclusive.

The terms "substantially" and "about" used throughout this disclosure, including the claims, are used to describe and account for small fluctuations. For example, they can refer to less than or equal to ±5%, such as less than or equal to ±0.2%, such as less than or equal to ±1%, such as less than or equal to ±0.5%, such as less then or equal to ±0.2%, such as less than or equal to ±0.1%, such as less than or equal to ±0.05%.

Concentrations, amounts and other numerical data may be expressed or presented herein in a range format. Such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an Illustration, a numerical range of "1 weight % (wt %) to 5 wt %" should be interpreted to include not only the explicitly recited values of 1 wt % to 5 wt %, but also include individual values and sub-ranges within the indicated range. Thus, included in this numerical range are individual values, such as 2, 3.5, and 4, and sub-ranges, such as from 1-3, from 2-4, and from 3-5, etc. This same principle applies to ranges reciting only one numerical value. Furthermore, such an interpretation should apply regardless of the breadth of the range or the characteristics being described.

The phrase "and/or," as used herein in this disclosure, including the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one example, to A only (optionally including elements other than B); in another example, to B only (optionally including elements other than A); in yet another example, to both A and B (optionally including other elements); etc.

As used in this disclosure, including the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims. "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in this disclosure, including the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements.

In this disclosure, including the claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, § 2111.03.

What is claimed:

1. A method of manufacturing, comprising:
    printing multiple layers comprising a metal material by an additive manufacturing technique, wherein each of the multiple layers comprises an array of cavities, at least one of the cavities in each of the multiple layers having a closed, polygonal cross-section in a plane extending along a length of that layer; and
    assembling at least two of the multiple layers to form an article having an array of three-dimensional hollow cells, each of the three-dimensional hollow cells comprising two or more of the cavities in alignment with each other.

2. The method of claim 1, wherein the additive manufacturing technique involves at least one of stereolithography, selective laser sintering, laminated object manufacturing, fused deposition modeling, solid ground curing, and inkjet printing.

3. The method of claim 1, wherein the assembling comprises at least one of laser welding and stud welding.

4. The method of claim 1, wherein the metal material comprises at least one of aluminum, magnesium, lithium, zinc, titanium, niobium, iron, copper, an alloy of any of the foregoing, and a combination of any of the foregoing.

5. The method of claim 1, wherein the closed polygonal cross-section is one of a hexagon and an octagon.

6. The method of claim 1, further comprising determining an optimized geometry for at least one of the cavities and the hollow cells and using the optimized geometry for the printing.

7. The method of claim 1, further comprising assembling an electrical circuit with the article, the article external to the electrical circuit.

* * * * *